(12) United States Patent
Yoshimura

(10) Patent No.: US 11,222,972 B2
(45) Date of Patent: Jan. 11, 2022

(54) SEMICONDUCTOR DEVICE AND MANUFACTURING METHOD THEREOF

(71) Applicant: ABLIC Inc., Chiba (JP)

(72) Inventor: Mitsuhiro Yoshimura, Chiba (JP)

(73) Assignee: Ablic Inc., Chiba (JP)

( * ) Notice: Subject to any disclaimer, the term of this patent is extended or adjusted under 35 U.S.C. 154(b) by 1 day.

(21) Appl. No.: 16/825,525

(22) Filed: Mar. 20, 2020

(65) Prior Publication Data

US 2020/0312993 A1 Oct. 1, 2020

(30) Foreign Application Priority Data

Mar. 29, 2019 (JP) ................ JP2019-065171

(51) Int. Cl.
  *H01L 29/78* (2006.01)
  *H01L 29/66* (2006.01)
  *H01L 29/417* (2006.01)
  *H01L 29/06* (2006.01)

(52) U.S. Cl.
  CPC ...... *H01L 29/7804* (2013.01); *H01L 29/0611* (2013.01); *H01L 29/41741* (2013.01); *H01L 29/66734* (2013.01); *H01L 29/7813* (2013.01)

(58) Field of Classification Search
  CPC ..................... H01L 29/7804–7808
  See application file for complete search history.

(56) References Cited

U.S. PATENT DOCUMENTS

| 6,455,378 B1* | 9/2002 | Inagawa | H01L 29/7808 438/270 |
| 2009/0230467 A1* | 9/2009 | Nakazawa | H01L 29/407 257/334 |

FOREIGN PATENT DOCUMENTS

JP 2006-093505 4/2006

\* cited by examiner

*Primary Examiner* — Raj R Gupta
(74) *Attorney, Agent, or Firm* — Crowell & Moring LLP

(57) ABSTRACT

A semiconductor device includes a semiconductor substrate, a trench provided in the semiconductor substrate, a trench gate formed in the trench, a vertical transistor having the trench gate, an active region having the vertical transistor, a field region surrounding the active region and having a protection diode, and a field insulating film formed on a surface of the semiconductor substrate, the protection diode being formed on the field insulating film. The trench gate includes a first polysilicon layer and has an embedded part embedded in the trench and an extension part connected to the embedded part and extending onto the surface of the semiconductor substrate, the protection diode includes a second polysilicon layer thicker than the first polysilicon layer, and an overlapping part having the second polysilicon layer is formed on the extension part.

4 Claims, 12 Drawing Sheets

SEMICONDUCTOR DEVICE AND MANUFACTURING METHOD THEREOF

RELATED APPLICATIONS

This application claims priority to Japanese Patent Application No. 2019-065171, filed on Mar. 29, 2019, the entire content of which is incorporated herein by reference.

BACKGROUND OF THE INVENTION

1. Field of the Invention

The present invention relates to a semiconductor device, in particular to a semiconductor device having a gate protection diode and a vertical transistor which includes a trench gate and a gate insulating film.

2. Description of the Related Art

A semiconductor device having a vertical transistor which includes a gate insulating film usually has a gate protection diode which protects the gate insulating film from an ESD (Electro-Static Discharge) or the like. Such a protection diode is formed of a polysilicon film or the like provided on the insulating film and made from the same polysilicon layer which constitutes a gate.

Japanese Patent Application Laid-open No. 2006-93505 discloses a technology in which a polysilicon layer containing no impurity is deposited within a trench and on a semiconductor substrate, and the trench gate and a protection diode are separately formed at the same time by impurity introduction by vapor-phase thermal diffusion and patterning in a vertical transistor having a trench gate and a gate insulating film. In the formation of the trench gate, in general, a method of depositing a polysilicon film having a film thickness approximately equal to a trench width to bury the polysilicon layer within a trench without any space and leaving the polysilicon layer within the trench by etchback is adopted. Trench gate means a gate electrode embedded in a trench of a vertical transistor.

In recent years, in order to cope with miniaturization and an increase in current in a vertical transistor having a trench gate and a gate insulating film, miniaturization of a trench width has been developed. Correspondingly, the polysilicon film for forming the trench gate has tended to be made thin. Further, since low voltage driving of the trench gate has been required, thinning of the gate insulating film and an accompanying voltage reduction in the protection diode have been needed.

Thinning of the deposited polysilicon layer along with the reduction of the trench gate width, however, causes simultaneously thinning of the polysilicon layer of the protection diode made from the same polysilicon layer as the trench gate, resulting in lowering of the ESD resistance together with lowering of the current capacity. To suppress the lowering of the ESD resistance, it is necessary to increase the PN junction area of the protection diode for the purpose of increasing the current capacity, however leading to an increase in the required area of the protection diode, thereby causing difficulty in reducing the size of the semiconductor device. Together with the thinning of the polysilicon layer there is also a possibility that a gate contact which electrically connects the trench gate and a metal wiring will penetrate the lower polysilicon layer, thereby causing deterioration in electrical characteristics like the generation of a leak current.

On the other hand, since the amount of etchback for the formation of the trench gate also increases when the polysilicon layer having a film thickness larger than the width of the trench is deposited, variation in the depth of the upper surface of the trench gate increases with an increase in etching variation. Then, the variation in the depth of the upper surface of the trench gate causes variation in the channel length of the transistor, thereby leading to deterioration in electrical characteristics like variation in vertical transistor characteristics.

SUMMARY OF THE INVENTION

It is an object of the present invention to provide a semiconductor device and a manufacturing method of the semiconductor device in which suppression of degradation in ESD resistance of a gate protection diode caused by reduction of a trench and deterioration in electrical characteristics of a vertical transistor is possible.

According to an embodiment of the present invention the following semiconductor device is provided.

A semiconductor device includes a semiconductor substrate, a trench provided in the semiconductor substrate; a trench gate formed in the trench; a vertical transistor having the trench gate; an active region having the vertical transistor; a field region surrounding the active region and having a protection diode; and a field insulating film formed on a surface of the semiconductor substrate, the protection diode being formed on the field insulating film. The trench gate includes a first polysilicon layer and has an embedded part embedded in the trench and an extension part connected to the embedded part and extending onto the surface of the semiconductor substrate, the protection diode includes a second polysilicon layer thicker than the first polysilicon layer, and an overlapping part having the second polysilicon layer is formed on the extension part.

Further, according to an embodiment of the present invention the following manufacturing method of a semiconductor device is provided.

A manufacturing method of a semiconductor device includes forming a trench in an active region of a semiconductor substrate, forming a field insulating film in a field region surrounding the active region, and forming a gate insulating film on bottom and side surfaces of the trench; forming a first polysilicon layer containing a high concentration impurity on the semiconductor substrate with a film thickness up to burying of the trench, and etching the first polysilicon layer in the active region to thereby form a trench gate and an extension part; and forming a second polysilicon layer thicker in film thickness than the first polysilicon layer on the semiconductor substrate, etching the second polysilicon layer, thereby forming an overlapping part on the extension part, and forming a protection diode on the field insulating film.

According to the present invention, independent setting of the thickness of the polysilicon layers enables the polysilicon layer for the protection diode and the polysilicon layer below a gate contact to be thick, and enables the polysilicon layer for the trench gate to have a film thickness corresponding to the trench width. It is thus possible to suppress degradation in ESD resistance of the gate protection diode accompanying reduction of the size of the trench and variation in electrical characteristics of the vertical transistor having the trench gate and the gate insulating film.

DETAILED DESCRIPTION OF THE PREFERRED EMBODIMENTS

Figure 1A:
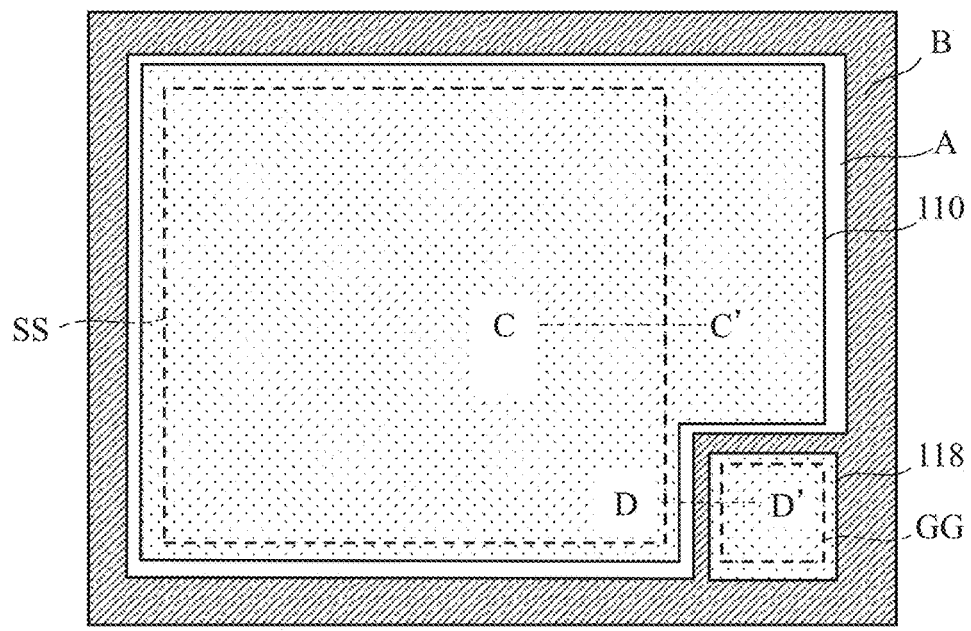
FIG. 1A is a plan view of a semiconductor device according to an embodiment of the present invention.

An embodiment of the present invention will hereinafter be described with reference to the accompanying drawings. The drawings used in the following description may be shown with being partly omitted, enlarged and seen through in order to make the features of the present invention easier to understand, and their dimension ratios may be different from the actual ones. Incidentally, the same components are denoted by the same reference numerals, and their duplicated explanations will be omitted as appropriate.

Figure 1B:
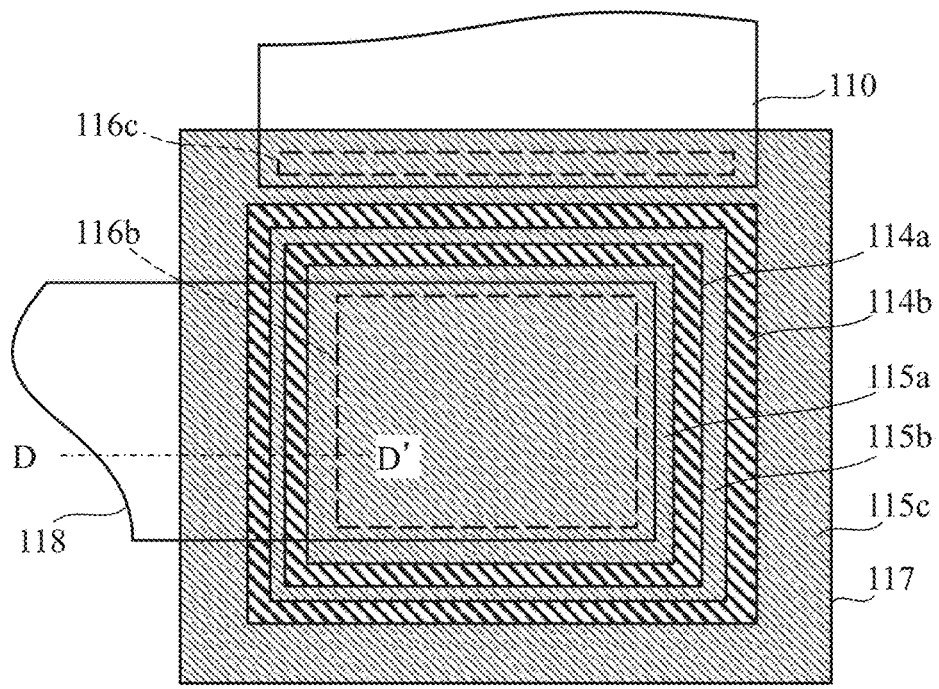
FIG. 1B is an enlarged plan view of the vicinity of a gate pad in FIG. 1A.

FIG. 1A is a schematic plan view to describe a semiconductor device 100 having a vertical MOSFET with trench gate according to the embodiment of the present invention. FIG. 1B is a schematic plan view showing the vicinity of a gate pad GG in FIG. 1A which is enlarged and partly seen through.

As illustrated in FIG. 1A, the semiconductor device 100 includes an active region A and a field region B provided along the perimeter of the active region A. The vertical MOSFET with trench gate (not illustrated) is formed in the active region A on which a source metal layer 110 connected to a source of the vertical MOSFET with trench gate is provided. The vertical MOSFET with trench gate is not formed in the field region B on which a protection diode 117 which has one end connected to the source metal layer 110 and the other end connected to a gate metal layer 118 is formed to protect a gate insulating film (not illustrated) from an ESD. Though the ESD resistance of the protection diode 117 is enhanced according to increase in its areas, it is necessary to reduce the area of the active region A on which the vertical MOSFET with trench gate is formed if the area of the field region B on which the protection diode 117 is formed is increased. Increasing the area of the protection diode 117 is therefore not preferable for reduction of the size of the semiconductor device 100.

A protection film 111 is formed on the active region A and the field region B. The protection film 111 lying on the source metal layer 110 and the gate metal layer 118 is provided with openings. The opening on the source metal layer 110 serves as a source pad SS and is used as a source electrode. The opening on the gate metal layer 118 serves as a gate pad GG and is used as a gate electrode. Further, a drain metal layer is formed on the entirety of the rear surface of a semiconductor substrate 140 (not illustrated) and is used as a drain electrode. That is, the vertical MOSFET with trench gate included in the semiconductor device 100 is a vertical transistor which controls the current flowing vertically from the rear surface to the front surface by the trench gate 106 (illustrated in FIGS. 2A and 2B).

As illustrated in FIG. 1B in which the vicinity of the gate pad GG is seen through, beneath the gate metal layer 118 the protection diode 117 made from a polysilicon layer is formed, and P-type impurity regions 114a and 114b and N-type impurity regions 115a, 115b, and 115c are provided concentrically in plan view as viewed from the direction perpendicular to the surface of the semiconductor device 100. The protection diode 117 is a bidirectional diode using a plurality of PN junctions formed by the P-type impurity region 114a, the N-type impurity region 115b, the P-type impurity region 114b, and the N-type impurity region 115c which surround the outside of the central N-type impurity region 115a one after another. Then, the N-type impurity region 115c which serves as one end of the protection diode 117 is connected to the gate metal layer 118 through the gate contact 116b, and the N-type impurity region 115a which serves as the other end thereof is connected to the source metal layer 110 (not illustrated), whereby the gate insulating film is protected from an ESD applied between the gate electrode and the source electrode.

The protection diode 117 allows a current generated by the ESD to pass when the applied voltage reaches a holding voltage corresponding to each breakdown voltage of PN junctions existing between the P-type impurity regions and the N-type impurity regions and the number of PN junctions. Further, the current capacity of the protection diode 117 which is needed to avoid complete destruction by the ESD increases with an increase in PN junction area as viewed in the cross-section. Generally, in the configuration of the protection diode 117, the number of the PN junctions is adjusted so that the protection diode 117 reaches a holding voltage lower than the breakdown voltage of the gate insulating film which should be protected, and the PN junction area is set to have a current capacity capable of withstanding the current generated by the ESD.

Figure 2A:
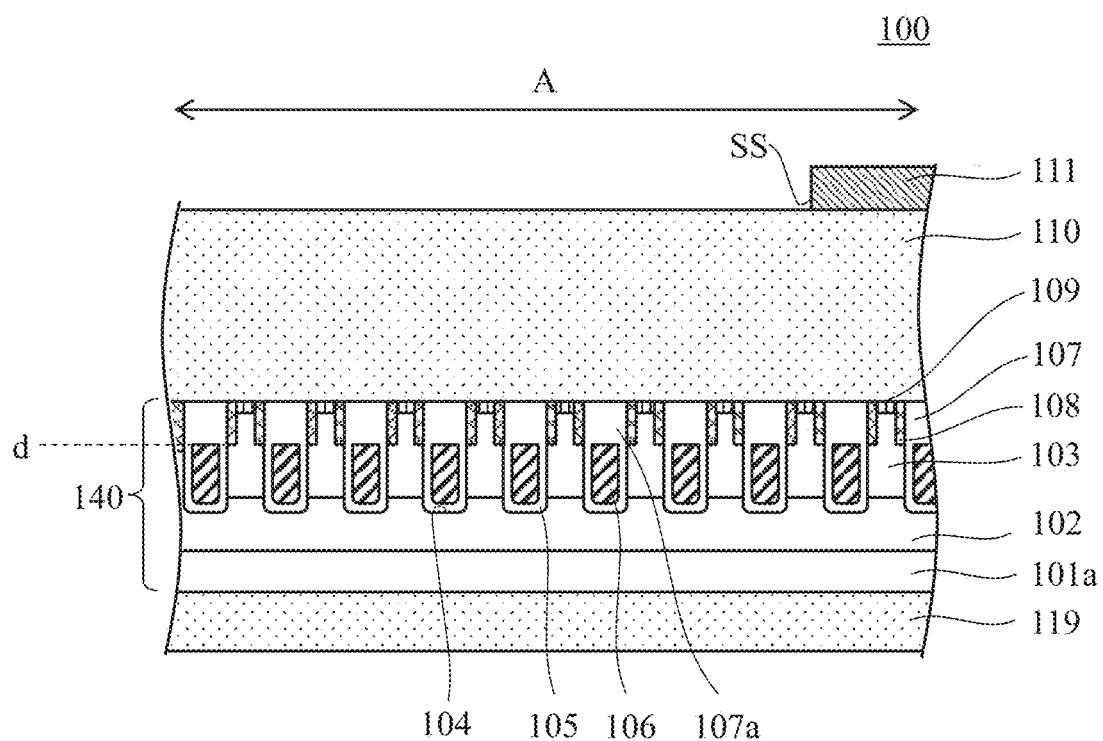
FIG. 2A is a sectional view taken along line C-C' of FIG. 1A.
Figure 2B:
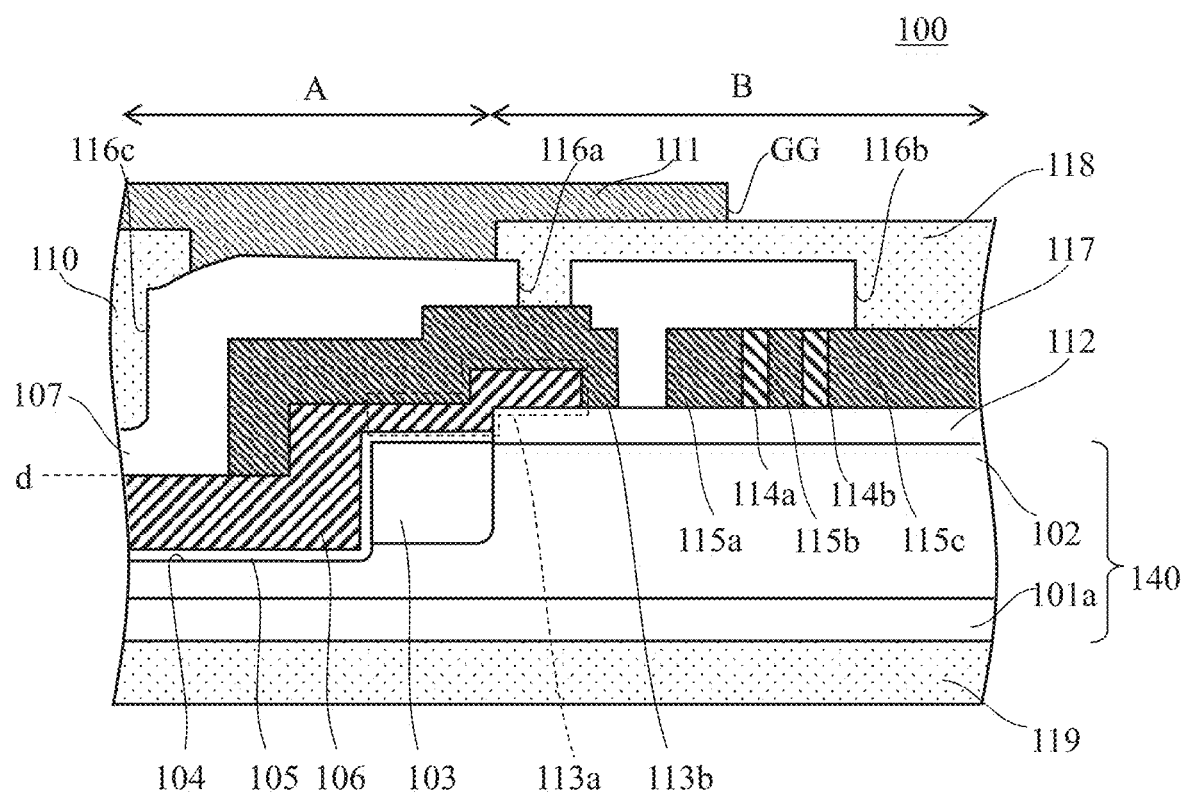
FIG. 2B is a sectional view taken along line D-D'.

FIG. 2A is a sectional view taken along line C-C' of FIG. 1A to describe the structure of the vertical MOSFET with trench gate in the semiconductor device 100. Further, FIG. 2B is a sectional view taken along line D-D' of FIG. 1A to describe a boundary part between the active region A and the field region B and a part of the protection diode.

As illustrated in FIG. 2A, the semiconductor device 100 has a vertical transistor including a drain formed of a high-concentration semiconductor layer 101a of an N-type conductivity having a high impurity concentration (hereinafter referred to as an $N^+$ type) which is formed in the semiconductor substrate 140, and a drift region 102 of an N-type conductivity having a low impurity concentration which is provided on the high concentration semiconductor layer 101a, a base region 103 of a P-type conductivity formed on the drift region 102, and an $N^+$ type source region 108 formed on the base region 103. A drain metal layer 119 is formed on the rear surface of the semiconductor substrate 140 and used as a drain electrode, and the source metal layer 110 is formed on the surface of the semiconductor substrate 140 and used as a source electrode.

Each of trenches 104 has a depth which penetrates the base region 103 from the surface of the semiconductor substrate 140 and reaches an upper surface of the drift region 102. A gate insulating film 105 is formed in each trench 104 so as to cover inner side surface and bottom surface. Intervened by the gate insulating film 105, an $N^+$ type trench gate 106, which is also a gate electrode, formed of a first polysilicon layer is embedded in the trench 104 from the bottom of the trench 104 to a position d below the surface of the semiconductor substrate 140, forming an embedded part of the gate electrode. Further, an insulating film 107 is embedded on the trench gate 106 in the trench 104 to the height of the surface of the semiconductor substrate 140.

An $N^+$ type source region 108 having a depth from the surface of the semiconductor substrate 140 to the position of d is provided in a region adjacent to an upper outer surface of the trench 104. Further, a P-type base contact region 109 having a higher impurity concentration than the base region 103 is provided on the surface of the semiconductor substrate 140 between the adjacent source regions in the base region 103.

Next, a portion for leading the trench gate 106 in the trench 104 to the outside of the trench 104, and a structure of the protection diode to protect the gate insulating film 105 from the ESD will be described with reference to FIG. 2B.

The trench gate 106 formed in the trench 104 is led out onto the gate insulating film 105 on the surface of the semiconductor substrate 140 at the end of the active region A and further connected to an extension part 113a extended onto a field insulating film 112 in the field region B. An overlapping part 113b formed of a second polysilicon layer of the same N+ type as the trench gate 106 and the extension part 113a covers the extension part 113a and is electrically connected to the trench gate 106 through the extension part 113a.

A protection diode 117 made of the second polysilicon layer is formed on the field insulating film 112. The P-type impurity regions 114a and 114b and the N-type impurity regions 115a, 115b, and 115c are selectively arranged in the protection diode 117. The protection diode 117 is a two-terminal device in which the N-type impurity region 115c on the right side of the sheet is one end, and the N-type impurity region 115a on the left side of the sheet is the other end.

The insulating film 107 is formed on the overlapping part 113b and the protection diode 117. Further, contact holes 116a and 116b are formed on the overlapping part 113b and the one end of the protection diode 117 in the insulating film 107. The gate metal layer 118 and the source metal layer 110 are provided on the insulating film 107. The gate metal layer 118 is formed to bury the contact holes 116a and 116b so that the trench gate 106 is electrically connected to the one end of the protection diode.

As illustrated in FIG. 2A, the source metal layer 110 is in contact with and electrically connected to the source region 108 and the base contact region 109 on the semiconductor substrate 140. In FIG. 2B, the source metal layer 110 is embedded in a source contact 116c formed to the depth reaching the surface of the semiconductor substrate 140 on the trench 104 and is electrically isolated from the trench gate 106 to avoid contact. Further, as illustrated in FIG. 1B, the source metal layer 110 is connected to the other end of the protection diode 117 through the source contact 116c.

Since the source metal layer 110 and the gate metal layer 118 are constituted to contact with the underlying layers while the upper surface of the insulating film 107 is substantially planarized above the semiconductor substrate 140, the source contact 116c is made deeper in depth than the gate contact 116a. Since the source contact 116c and the gate contact 116a are formed by etching in the same process, the extension part 113a below the gate contact 116a tends to be excessively etched by this etching. In the case where the layer formed on the field insulating film 112 is only the extension part 113a formed of the polysilicon layer 121a, the gate contact 116a may penetrate the extension part 113a by the excessive etching if the film thickness of the polysilicon layer 121a becoming 0.2 μm or less.

In the embodiment of the present invention, since the overlapping part 113b formed of the polysilicon layer 121b is provided on the extension part 113a formed of the polysilicon layer 121a, penetration of the gate contact 116a through the extension part 113a is suppressed against the excessive etching. Accordingly, even if the polysilicon layer 121a is made thin simultaneously with size-reduction of the trench 104, it is possible to suppress deterioration in electrical characteristics due to the generation of a leak current and the like caused by the penetration of the gate contact 116c.

An insulating film 111 is provided on the source metal layer 110 and the gate metal layer 118 to expose a part of the upper surface of the source metal layer 110 and a part of the upper surface of the gate metal layer 118 to thereby form a gate pad GG and a source pad SS.

On the other hand, as illustrated in FIG. 2B, the second polysilicon layer which constitutes the protection diode 117 is formed of a different polysilicon layer from the first polysilicon layer which constitutes the trench gate 106. Accordingly, the protection diode 117 is not affected by thinning of the first polysilicon layer required along the size-reduction of the width of the trench 104. The size of the sectional area of the PN junction of the protection diode 117 which determines the current capacity of the protection diode 117 is proportional to the length at which the P-type impurity layer 114a and the N-type impurity region 115a in FIG. 2B contact in the vertical direction on the paper. Accordingly, the film thickness of the second polysilicon layer which forms the protection diode 117 may be made thick to increase the area of the PN junction without increasing the area of the protection diode 117 in plan view. The present embodiment is thus capable of suppressing degradation in ESD resistance of the gate protection diode along the size-reduction of the trench against the conventional configuration in which the polysilicon layer for the gate electrode, which includes the trench gate, and the polysilicon layer for the protection diode are the same.

A method of manufacturing the semiconductor device according to the embodiment of the present invention will next be described with reference to the sectional views of FIGS. 3 to 11.

Figure 3:
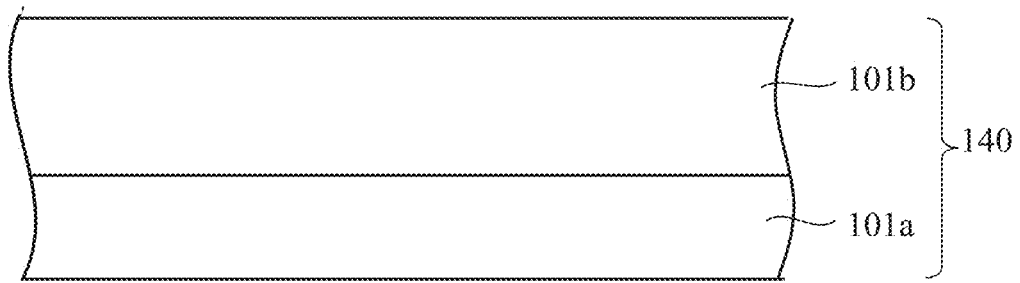
FIG. 3 is a sectional view illustrating a manufacturing process of the semiconductor device according to the embodiment of the present invention.

First, as illustrated in FIG. 3, a semiconductor substrate 140 having an epitaxial layer 101b of an N-type conductivity containing a low impurity concentration is prepared on a high concentration semiconductor layer 101a of an $N^+$ type.

Figure 4A:
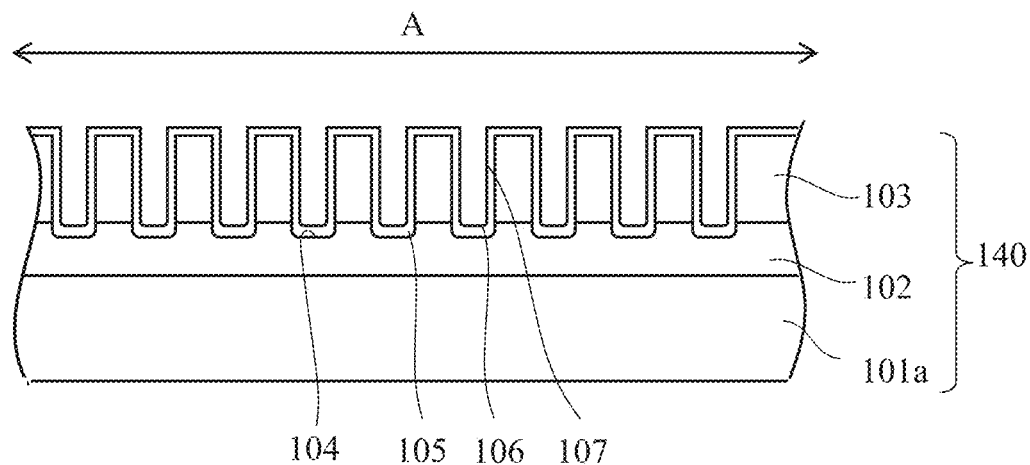
FIG. 4A illustrates a manufacturing process of the semiconductor device according to the embodiment of the present invention and is a sectional view taken along line C-C' of FIG. 1A.
Figure 4B:
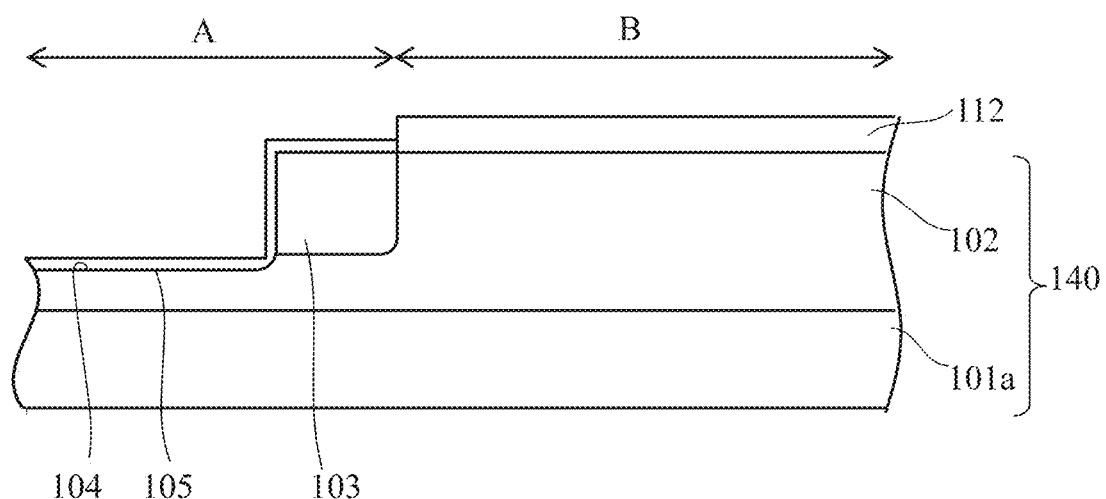
FIG. 4B is a sectional view taken along line D-D'.

Next, as illustrated in FIGS. 4A and 4B, a field insulating film 112, a base region 103, a trench 104, and a gate insulating film 105 are formed. FIG. 4A is a sectional view taken along line C-C' in the semiconductor device 100 of FIG. 1, and FIG. 4B illustrates a sectional view taken along line D-D'. Two cross-sections will be shown in a similar way in subsequent explanation as needed. Now, as illustrated in FIG. 4B, the field insulating film 112 is formed on a field region B of the semiconductor substrate 140 to partition an active region A in which a vertical MOSFET with trench gate is formed and the field region B other than the active region A. Next, a P-type base region 103 is formed in the field region A of the semiconductor substrate 140 by ion implantation and thermal diffusion. Then, an insulating film is deposited on the semiconductor substrate 140, and a part of the insulating film is etched to expose the surface of the semiconductor substrate 140. The exposed semiconductor substrate 140 is etched until the base region 103 is penetrated to form the trench 104 with the insulating film as a mask. Next, the insulating film is removed and the gate insulating film 105 is formed to cover the inner bottom and inner side surfaces of the trench 104. The base region 103 may be formed even after the formation of the trench 104. Any manufacturing process sequence may be adopted so long as such a configuration as illustrated in FIGS. 5A and 5B is taken.

Figure 5A:
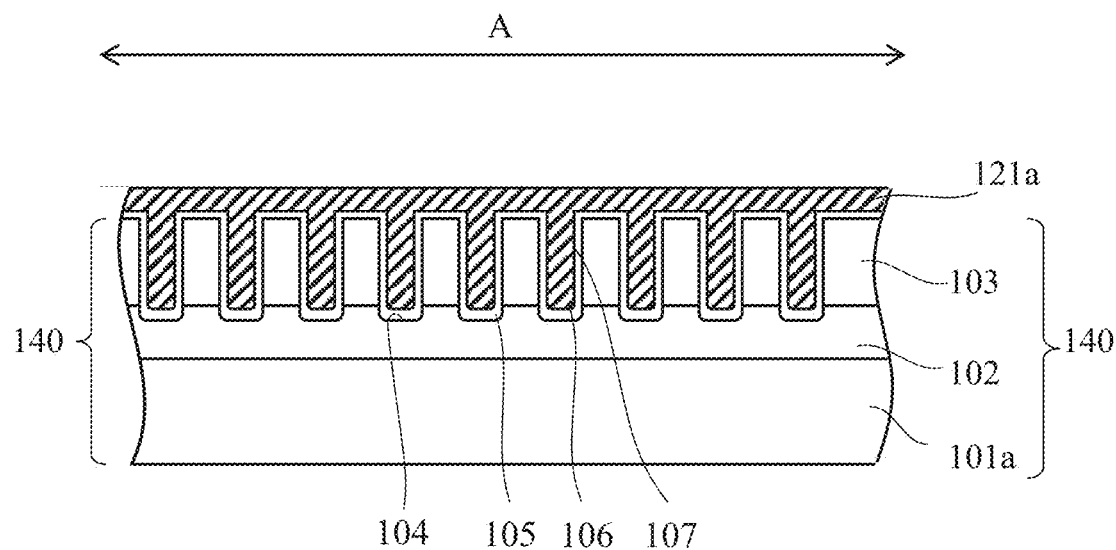
FIG. 5A illustrates a manufacturing process of the semiconductor device according to the embodiment of the present invention and is a sectional view taken along line C-C' of FIG. 1A.
Figure 5B:
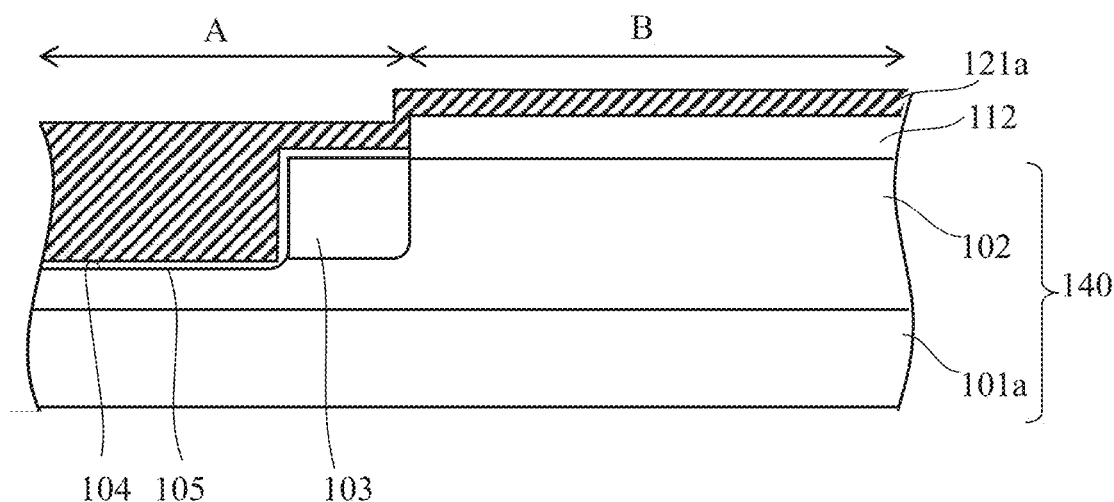
FIG. 5B is a sectional view taken along line D-D'.

Next, as illustrated in FIGS. 5A and 5B, an N+ type polysilicon layer 121a containing a high concentration impurity is deposited by chemical vapor deposition including gaseous impurity over the entire surface of the semiconductor substrate 140 to bury the trench 104 until the upper surface of the polysilicon film is planarized. In the case where the width of the trench 104 is 0.2 μm, for example, the polysilicon layer 121a is preferably deposited with a thickness of 0.2 μm for planarization of the upper surface. A defect in embedding of the polysilicon film into the trench is likely to occur when the film thickness of the polysilicon layer 121a is less than or equal to the width of the trench 104. On the other hand, variation in etching is likely to occur in a subsequent etchback process when the film thickness of the polysilicon layer 121a is formed beyond the width of the trench 104. The formation of the N+ type first polysilicon layer 121a may also be performed by impurity introduction by vapor-phase thermal diffusion after the deposition of the polysilicon layer containing no impurity.

Figure 6A:
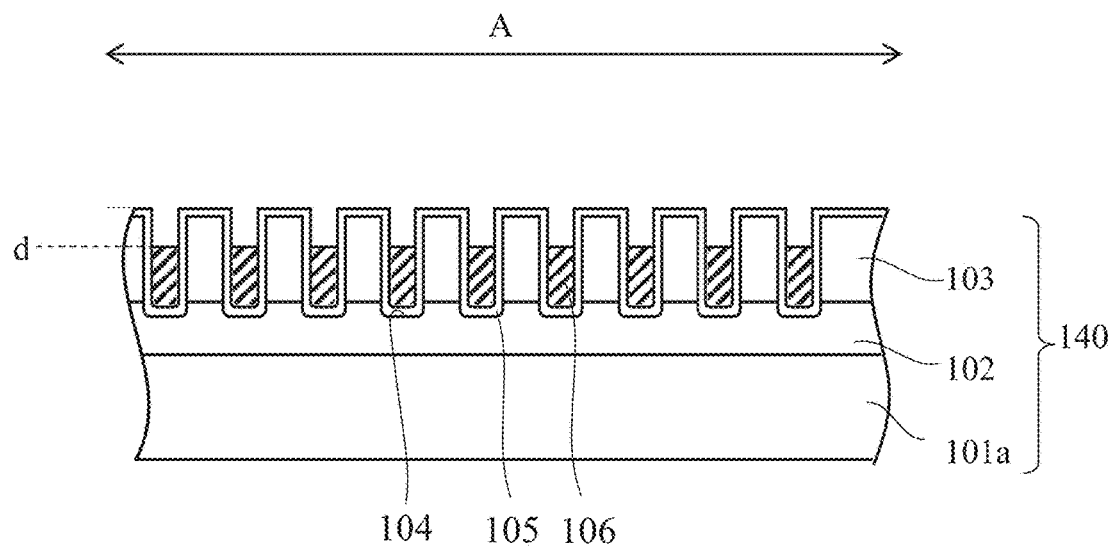
FIG. 6A illustrates a manufacturing process of the semiconductor device according to the embodiment of the present invention and is a sectional view taken along line C-C' of FIG. 1A.
Figure 6B:
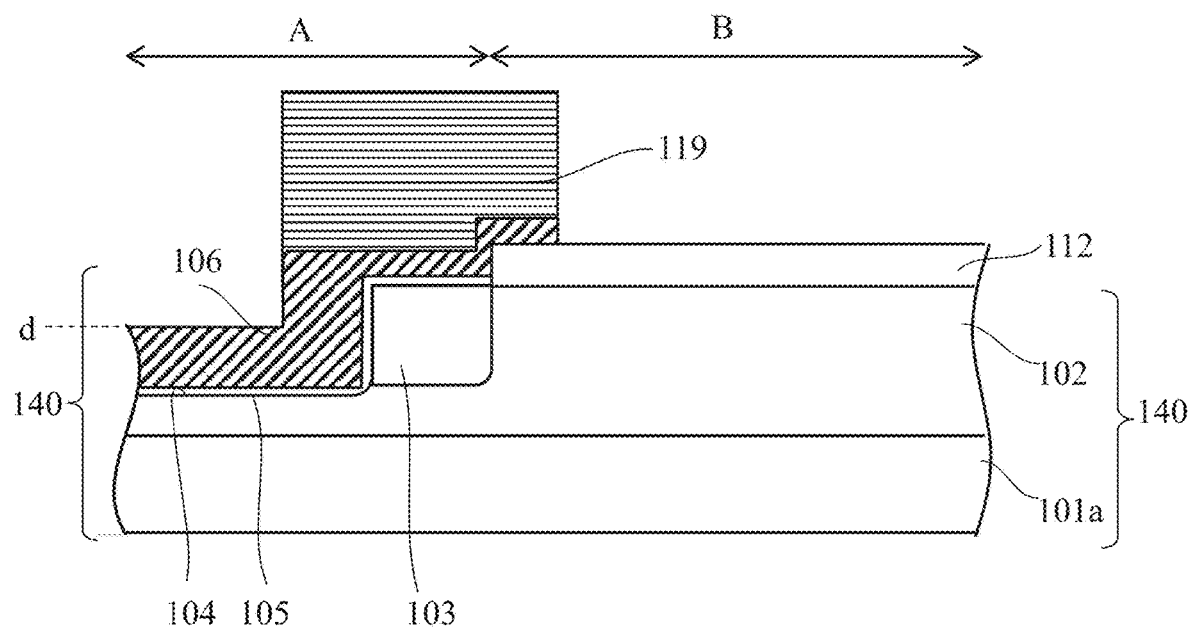
FIG. 6B is a sectional view taken along line D-D'.

Next, as illustrated in FIGS. 6A and 6B, etchback of the polysilicon layer 121a other than the part covered with a photoresist 119 at the boundary between the active region A and the field region B is carried out to form a trench gate 106. The polysilicon layer 121a in the field region B is all removed from the surface of the field insulating film 112 not covered with the photoresist 119 by this etching. Further, the polysilicon layer 121a in the active region A is all removed from the surface of the semiconductor substrate 140 not covered with the photoresist 119 but is left below the position d within the trench 104.

In the case where the film thickness of the polysilicon layer 121a on the surface of the semiconductor substrate 140 not covered with the photoresist 119 in the active region A is thick, the amount of etching increases correspondingly, and hence variation in the etching is also likely to increase. Then, with the progress of the etching within the trench 104 after the surface of the semiconductor substrate 140 is exposed in the active region A, the difference in etching variation is rapidly accelerated. The trend thereof becomes remarkable as the concentration of the impurity contained in the polysilicon layer 121a becomes high. Then, the variation leads to variation in the position d as the height of the trench gate 106 left in the trench 104, i.e., variation in the channel length of a trench type vertical MOSFET. For that reason, the film thickness of the polysilicon layer 121a on the surface of the semiconductor substrate 140 not covered with the photoresist 119 in the active region A is preferably made as thin as possible.

Figure 7A:
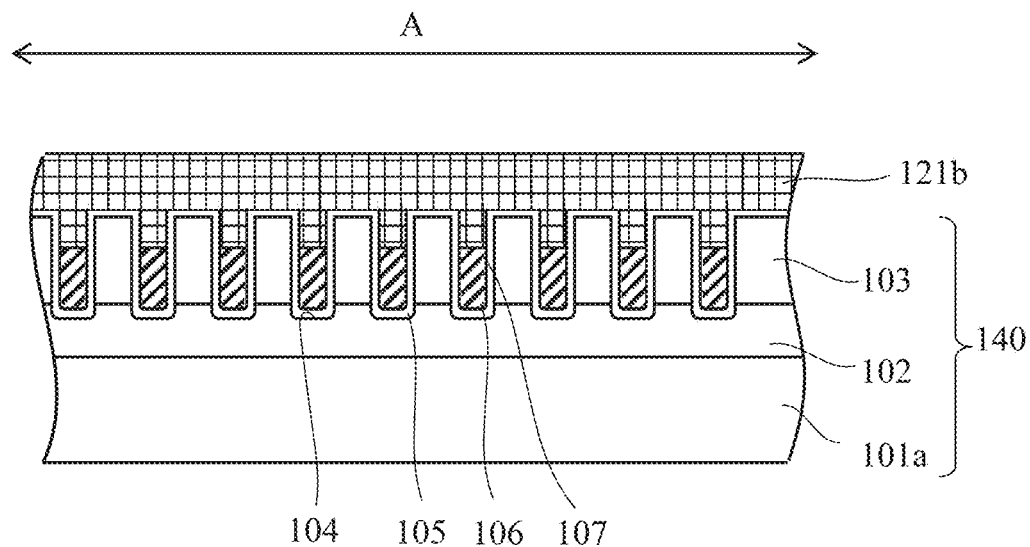
FIG. 7A illustrates a manufacturing process of the semiconductor device according to the embodiment of the present invention and is a sectional view taken along line C-C' of FIG. 1A.
Figure 7B:
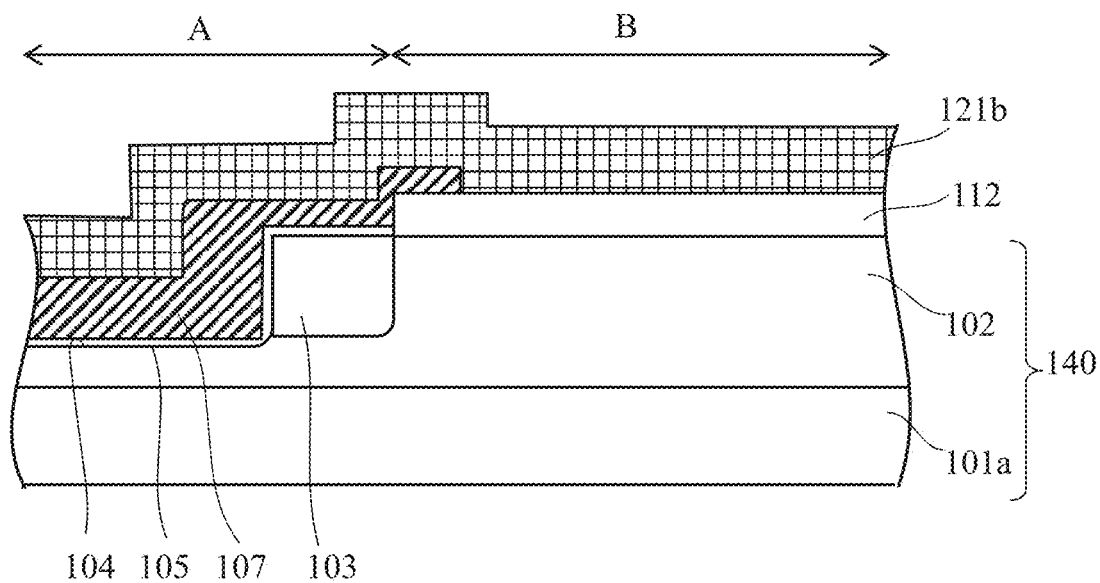
FIG. 7B is a sectional view taken along line D-D'.

Next, as illustrated in FIGS. 7A and 7B, the second polysilicon layer 121b containing no impurity is deposited on the entire surface of the semiconductor substrate 140. The polysilicon layer 121b is deposited with a thickness of 0.4 μm in the embodiment of the present invention. Increase in the thickness of the polysilicon layer 121b also enlarges the junction area in the PN junction of the protection diode. The film thickness of the polysilicon layer 121b may therefore be changed depending on the current capacity required for the protection diode, i.e., ESD resistance.

Figure 8:
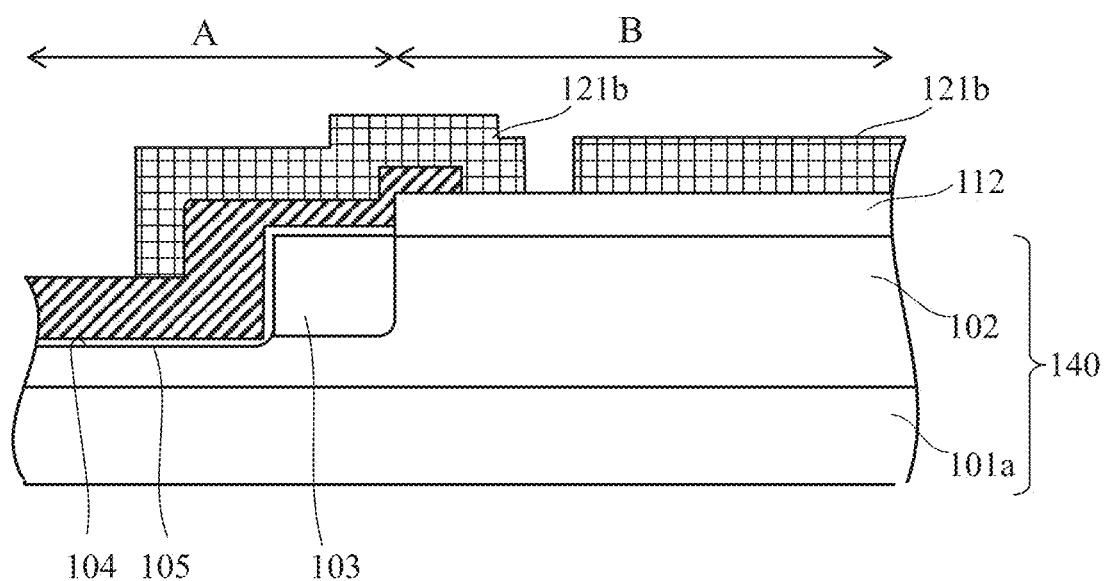
FIG. 8 illustrates a manufacturing process of the semiconductor device according to the embodiment of the present invention and is a sectional view taken along line D-D' of FIG. 1A.

Next, as illustrated in FIG. 8, other than a region where the protection diode is formed later and the boundary part between the active region A and the field region B, a part of the polysilicon layer 121b which contains no impurity is removed by etching. FIG. 8 is a sectional view taken along line D-D' in the semiconductor device 100 of FIG. 1 at this instant in manufacturing. In the cross section taken along line C-C', the polysilicon layer 121b is all removed to provide a similar configuration as illustrated in FIG. 6A. Since the polysilicon layer 121b contains no impurity, etching speed of the polysilicon layer 121b is slower than that of the polysilicon layer 121a. Further, the polysilicon layer 121b has enough etching selectivity to a natural oxide film formed on the first polysilicon layer 121a. For that reason, the polysilicon layer 121a is not etched soon following the etching of the polysilicon layer 121b.

Figure 9:
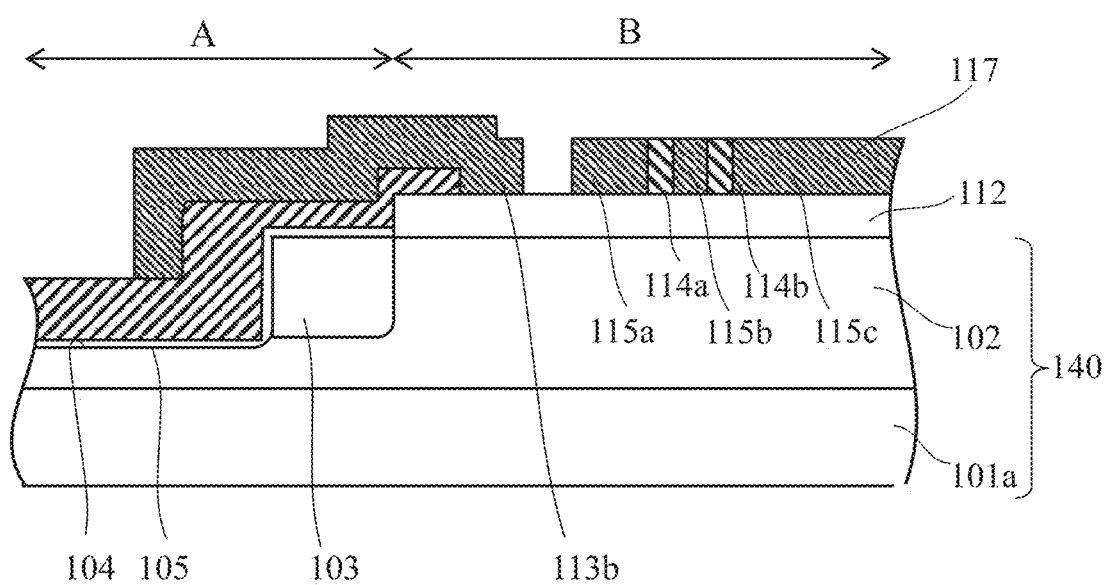
FIG. 9 illustrates a manufacturing process of the semiconductor device according to the embodiment of the present invention and is a sectional view taken along line D-D' of FIG. 1A.

Next, as illustrated in FIG. 9, an impurity is implanted in the polysilicon layer 121b to change the conductivity to the N+ type at the boundary part between the active region A and the field region B to form an overlapping part 113b. Simultaneously, the impurity is implanted to change the conductivity to the N+ type even in a part of the polysilicon layer 121b on the field insulating film 112 to form N-type impurity regions 115a, 115b, and 115c. Next, in the polysilicon layer 121b, a P-type impurity is implanted in another part of the N-type impurity regions of the polysilicon layer 121b on the field insulating film 112 to form P-type impurity layers 114a and 114b. By doing so, the protection diode 117 having a PN junction is formed.

Figure 10:
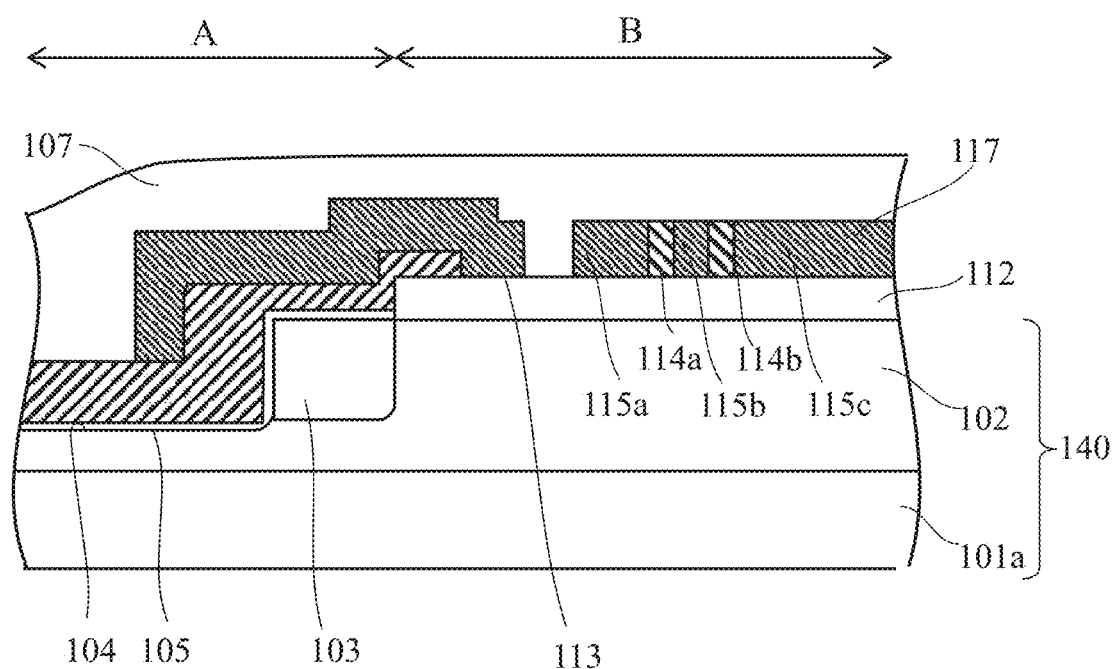
FIG. 10 illustrates a manufacturing process of the semiconductor device according to the embodiment of the present invention and is a sectional view taken along line D-D' of FIG. 1A.

Next, as illustrated in FIG. 10, an insulating film 107 is deposited on the entire surface of the semiconductor substrate 140.

Figure 11:
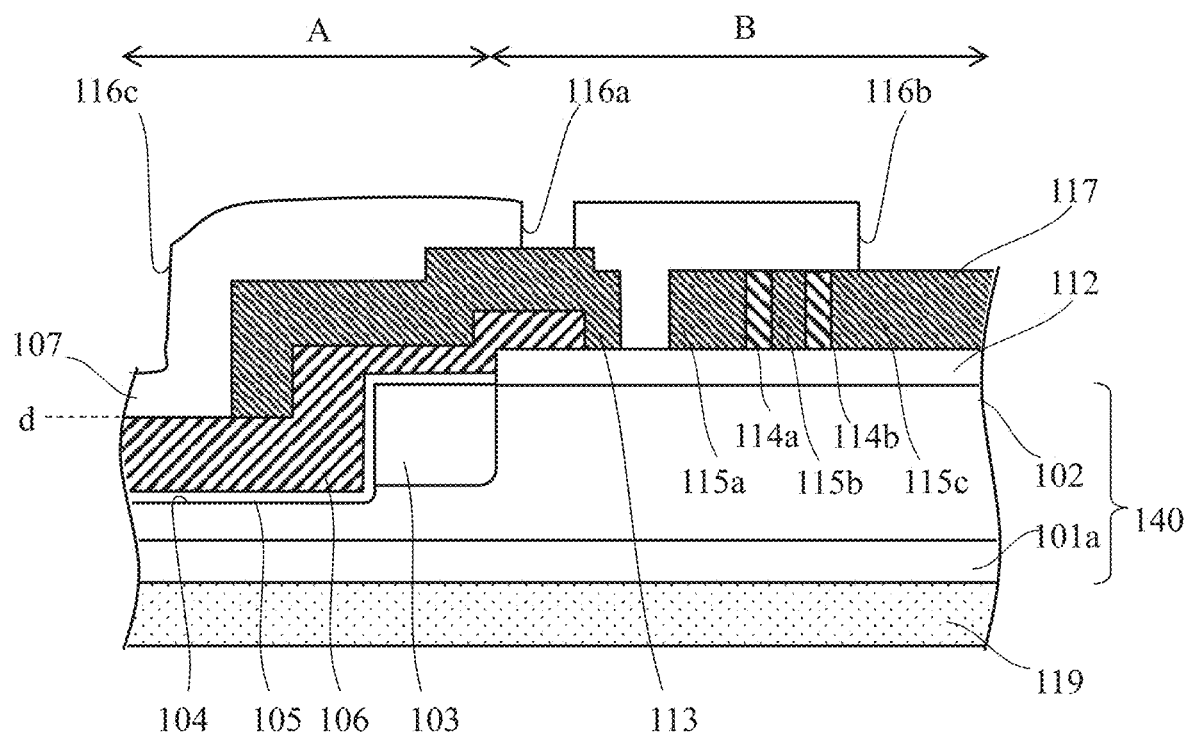
FIG. 11 illustrates a manufacturing process of the semiconductor device according to the embodiment of the present invention and is a sectional view taken along line D-D' of FIG. 1A.

Next, as illustrated in FIG. 11, a predetermined region of the insulating film 107 is etched to form gate contacts 116a and 116b and a source contact 116c.

Next, the deposition of a metal wiring and etching of the predetermined region are performed to form a gate metal layer 118 and a source metal layer 110. At last, a protection film 111 is deposited on the entire surface of the semiconductor substrate 140, and the predetermined portions of the protection film 111 are removed to form openings for a gate pad GG and a source pad SS, thereby obtaining a structure as illustrated in FIGS. 2A and 2B.

By the manufacturing method of the embodiment of the present invention, in the semiconductor device 100 the different polysilicon layers 121a and 121b can be used for the trench gate and the protection diode, respectively and the polysilicon layers having the film thicknesses suitable for each of the trench gate and the protection diode can be adopted. It is thereby possible to realize suppression of degradation in the ESD resistance of the gate protection diode along size-reduction of the trench and variation in the electrical characteristics of the vertical transistor having the trench gate and the gate insulating film.

What is claimed is:

1. A semiconductor device, comprising:
   a semiconductor substrate;
   a trench provided in the semiconductor substrate;
   a trench gate formed in the trench;
   a vertical transistor having the trench gate;
   an active region having the vertical transistor;
   a field region surrounding the active region and having a protection diode; and
   a field insulating film formed on a surface of the semiconductor substrate, the protection diode being formed on the field insulating film,
   wherein the trench gate comprises a first polysilicon layer and has an embedded part embedded in the trench and an extension part connected to the embedded part and extending onto the surface of the semiconductor substrate,
   wherein the protection diode comprises a second polysilicon layer thicker than the first polysilicon layer, and
   wherein an overlapping part having the second polysilicon layer is formed on the extension part.

2. The semiconductor device according to claim 1, further comprising:
   an insulating film formed on the vertical transistor and the protection diode;
   a first gate contact formed in the insulating film on the overlapping part;
   a second gate contact formed in the insulating film on one end of the protection diode; and
   a metal wiring electrically connecting the trench gate and the one end of the protection diode through the first gate contact and the second gate contact.

3. The semiconductor device according to claim 2, further comprising:
   a first source contact formed in the insulating film on a source of the vertical transistor;
   a second source contact formed in the insulating film on another end of the protection diode; and
   a metal wiring electrically connecting the source and the other end of the protection diode through the first source contact and the second source contact.

4. The semiconductor device according to claim 1, wherein the width of the trench is not more than 0.2 μm.

* * * * *